United States Patent
Costa et al.

(10) Patent No.: US 9,331,669 B2
(45) Date of Patent: May 3, 2016

(54) HIGH REJECTION SURFACE ACOUSTIC WAVE DUPLEXER

(71) Applicant: Resonant Inc., Santa Barbara, CA (US)

(72) Inventors: James R. Costa, Lompoc, CA (US); Kurt Raihn, Goleta, CA (US)

(73) Assignee: Resonant Inc., Santa Barbara, CA (US)

(*) Notice: Subject to any disclaimer, the term of this patent is extended or adjusted under 35 U.S.C. 154(b) by 0 days.

(21) Appl. No.: 14/730,019

(22) Filed: Jun. 3, 2015

(65) Prior Publication Data
US 2016/0028373 A1   Jan. 28, 2016

Related U.S. Application Data

(63) Continuation-in-part of application No. 14/495,494, filed on Sep. 24, 2014, now Pat. No. 9,077,312.

(60) Provisional application No. 62/029,279, filed on Jul. 25, 2014.

(51) Int. Cl.
*H03H 9/72* (2006.01)
*H03H 9/64* (2006.01)
*H03H 9/02* (2006.01)

(52) U.S. Cl.
CPC ........... *H03H 9/725* (2013.01); *H03H 9/02818* (2013.01); *H03H 9/02905* (2013.01); *H03H 9/02992* (2013.01); *H03H 9/6483* (2013.01); *H03H 9/6409* (2013.01)

(58) Field of Classification Search
CPC .......... H03H 9/02818; H03H 9/02842; H03H 9/02905; H03H 9/0296; H03H 9/09; H03H 9/6409; H03H 9/6483; H03H 9/725; H30H 9/02992

USPC ........................................... 333/133, 193–195
See application file for complete search history.

(56) References Cited

U.S. PATENT DOCUMENTS

| | | | | |
|---|---|---|---|---|
| 4,647,881 A | * | 3/1987 | Mitsutsuka | 333/194 |
| 5,287,036 A | * | 2/1994 | Penunuri | 310/313 R |
| 5,365,206 A | | 11/1994 | Machui et al. | |
| 5,396,199 A | * | 3/1995 | Tera et al. | 333/150 |
| 6,034,578 A | * | 3/2000 | Fujita et al. | 333/193 |

(Continued)

FOREIGN PATENT DOCUMENTS

| | | |
|---|---|---|
| EP | 1 548 936 A1 | 6/2005 |
| EP | 2 978 128 A1 | 1/2016 |

(Continued)

OTHER PUBLICATIONS

English language machine translation of JP 6-232688, published Aug. 19, 1994.*

(Continued)

*Primary Examiner* — Barbara Summons
(74) *Attorney, Agent, or Firm* — SoCal IP Law Group LLP; Steven C. Sereboff; John E. Gunther

(57) ABSTRACT

Filter devices and duplexer devices are disclosed. A filter device includes two or more surface acoustic wave resonators, including at least a first shunt resonator, formed on a surface of a substrate. A ground conductor formed on the surface of the substrate connects the first shunt resonator to a ground pad. At least a portion of an edge of the ground conductor is shaped as a plurality of serrations.

9 Claims, 9 Drawing Sheets

(56) References Cited

U.S. PATENT DOCUMENTS

| | | | |
|---|---|---|---|
| 6,380,823 B1 * | 4/2002 | Ikata et al. | 333/133 |
| 6,445,261 B1 * | 9/2002 | Yuda et al. | 333/133 |
| 7,385,468 B2 * | 6/2008 | Furusato et al. | 333/193 |
| 7,622,684 B2 * | 11/2009 | Takano | H03H 3/08 174/521 |
| 8,456,254 B2 * | 6/2013 | Taniguchi | 333/133 |
| 2004/0085161 A1 * | 5/2004 | Kushitani et al. | 333/195 |
| 2006/0214748 A1 | 9/2006 | Funami et al. | |
| 2009/0071711 A1 | 3/2009 | Takano et al. | |
| 2011/0084573 A1 * | 4/2011 | Yamaji et al. | 310/340 |
| 2012/0086309 A1 | 4/2012 | Yamaji et al. | |
| 2012/0319802 A1 | 12/2012 | Ochiai et al. | |

FOREIGN PATENT DOCUMENTS

| | | | | |
|---|---|---|---|---|
| JP | 6-232688 | * | 8/1994 | 333/195 |
| JP | 7-154201 | * | 6/1995 | |

OTHER PUBLICATIONS

European Patent Office, Extended Search Report for Application No. 15165514.9, Mail Date Jan. 5, 2016.

* cited by examiner

HIGH REJECTION SURFACE ACOUSTIC WAVE DUPLEXER

RELATED APPLICATION INFORMATION

This patent is a continuation in part of application Ser. No. 14/495,494, filed Sep. 24, 2014, entitled HIGH REJECTION SURFACE ACOUSTIC WAVE FILTER, now U.S. Pat. No. 9,077,312, which claims priority from Provisional Patent Application No. 62/029,279, filed Jul. 25, 2014, titled HIGH ISOLATION DUPLEXER, both of which are included by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to radio frequency filters using surface acoustic wave (SAW) resonators, and specifically to filters and duplexers incorporating SAW resonators to provide very high rejection or isolation in a predetermined frequency band.

2. Description of the Related Art

As shown in FIG. 1, a SAW resonator 100 may be formed by thin film conductor patterns formed on a surface of a substrate 105 made of a piezoelectric material such as quartz, lithium niobate, lithium tantalate, or lanthanum gallium silicate. A first inter-digital transducer (IDT) 110 may include a plurality of parallel conductors. A radio frequency or microwave signal applied to the first IDT 110 via an input terminal IN may generate an acoustic wave on the surface of the substrate 105. As shown in FIG. 1, the surface acoustic wave will propagate in the left-right direction. A second IDT 120 may convert the acoustic wave back into a radio frequency or microwave signal at an output terminal OUT. The conductors of the second IDT 120 may be interleaved with the conductors of the first IDT 110 as shown. In other SAW resonator configurations (not shown), the conductors forming the second IDT may be disposed on the surface of the substrate 105 adjacent to, or separated from, the conductors forming the first IDT.

The electrical coupling between the first IDT 110 and the second IDT 120 may be frequency-dependent. The electrical coupling between the first IDT 110 and the second IDT 120 typically exhibits both a resonance (where the impedance between the first and second IDTs is very high) and an anti-resonance (where the impedance between the first and second IDTs approaches zero). The frequencies of the resonance and the anti-resonance are determined primarily by the pitch and orientation of the interdigitated conductors, the choice of substrate material, and the crystallographic orientation of the substrate material.

Grating reflectors 130, 132 may be disposed on the substrate to confine most of the energy of the acoustic waves to the area of the substrate occupied by the first and second IDTs 110, 120. However a portion of the energy of the acoustic wave, represented by the dashed arrows 140, may leak or escape and propagate across the surface of the substrate. An acoustic wave propagating across the surface of the substrate may reflect at the edges of the substrate. Additionally, since the velocity of an acoustic wave is different between regions of the substrate that are and are not covered by conductors, a portion of the energy of an acoustic wave will reflect each time the acoustic wave encounters the edge of a conductor.

SAW resonators are used in a variety of radio frequency filters including band reject filters, band pass filters, and duplexers. A duplexer is a radio frequency filter device that allows simultaneous transmission in a first frequency band and reception in a second frequency band (different from the first frequency band) using a common antenna. Duplexers are commonly found in radio communications equipment including cellular telephones.

Filter circuits commonly incorporate more than one SAW resonator. For example, FIG. 2 shows a schematic diagram of a radio frequency filter circuit 200 incorporating nine SAW resonators, labeled Xa through Xi. The use of nine SAW resonators is exemplary and a filter circuit may include more or fewer than nine SAW resonators. The filter circuit 200 may be, for example, a band pass filter, a band reject filter, or a combination band pass/band reject filter depending on the characteristics of the SAW resonators.

In the filter circuit 200, SAW resonators Xa, Xc, Xe, Xg, and Xi may be referred to as "series resonators" since these five SAW resonators are connected in series between the two ports of the filter circuit. SAW resonators Xb, Xd, Xf, Xh may be referred to as "shunt resonators" since these four SAW resonators are each connected from a node between two series resonators and ground (and thus "shunt" some radio frequency energy to ground). While not used in the exemplary circuit of FIG. 2, a SAW resonator connected from one of the ports of a filter to ground would also be considered a "shunt resonator".

The nine SAW resonators Xa through Xi are typically fabricated in close proximity on a common substrate. Since the SAW resonators are in close proximity, acoustic energy that leaks from a first resonator may impinge upon one or more other resonators, either directly or after reflection from an edge of the substrate or an edge of a conductor pattern. The one or more other resonators that receive the leaked acoustic energy may convert some or all of the leaked acoustic energy into electrical signals. For example, acoustic energy leaking from SAW resonator Xa may impinge on SAW resonator Xg, as indicated by the dashed arrow 210, and acoustic energy leaking from SAW resonator Xb may impinge on SAW resonator Xf, as indicated by the dashed arrow 220. Leaked acoustic energy may effectively provide sneak paths by which RF signals can bypass portions of the filter circuit.

FIG. 3 shows a graph 300 comparing the simulated and measured performance of a combination band pass/band reject filter circuit similar to the filter circuit 200 shown in FIG. 2. The graph 300 plots |S(1,2)| (the magnitude in dB of the transfer function between port 1 and port 2 of the filter) as a function of frequency. The solid line 310 is the expected filter performance based on electromagnetic modeling of the filter circuit. The dashed line 320 is the measured performance of a prototype filter. The measured transfer function (dashed line) closely approximates the modeled performance (solid line) over the band pass region centered at 1.785 GHz. The measured transfer function (dashed line) deviates substantially (i.e. as much as 18 dB) from the modeled performance (solid line) over the frequency band from 1.805 GHz to 1.85 GHz. The unexpectedly low insertion loss of the actual filter in this frequency band may result, at least in part, from acoustic leakage paths that are not included in the electromagnetic modeling.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Figure 1:
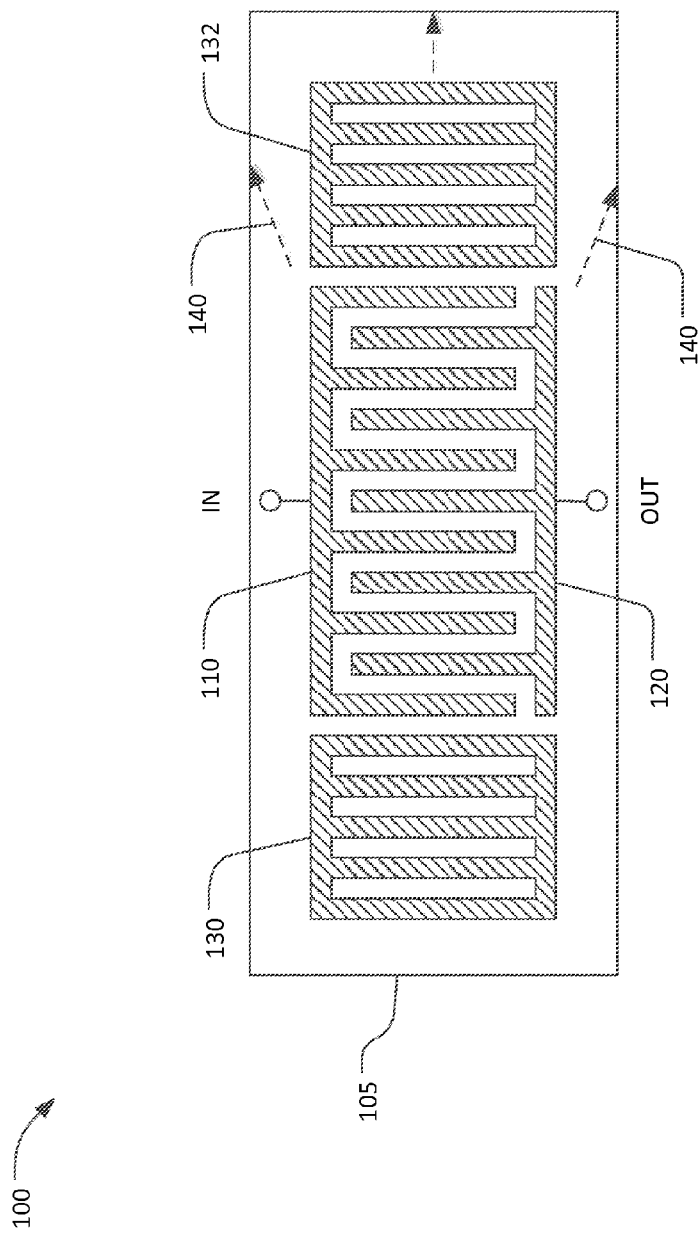
FIG. 1 is a schematic plan view of a SAW resonator.
Figure 2:
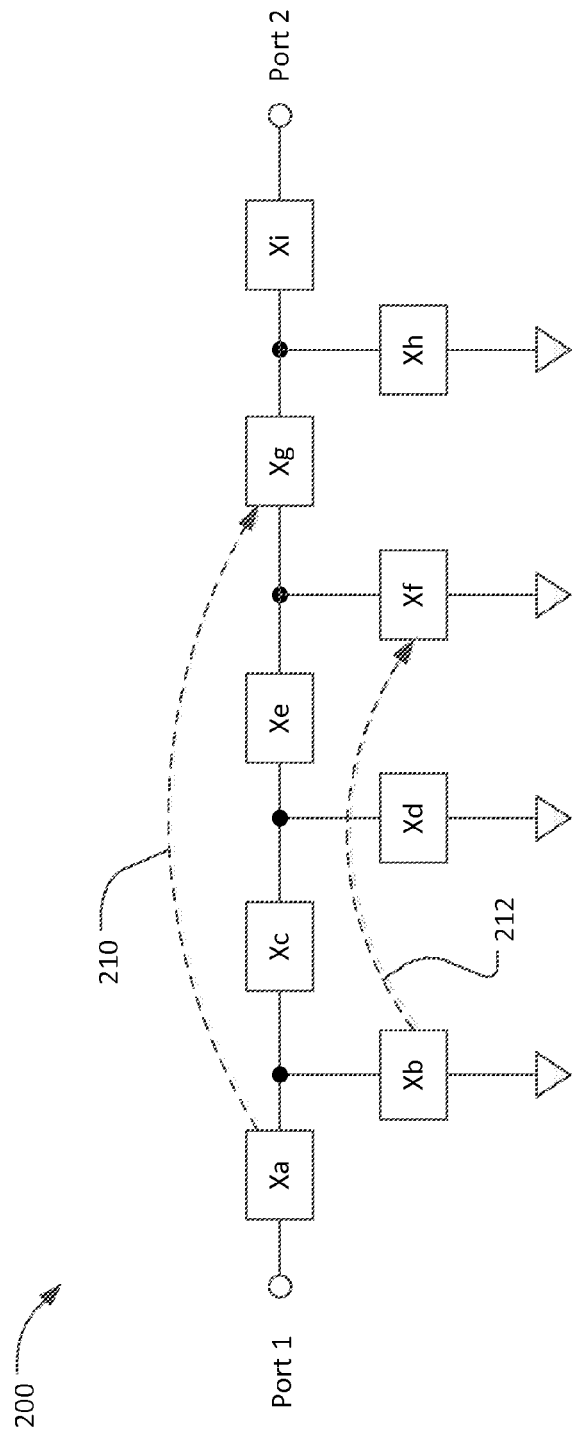
FIG. 2 is a schematic circuit diagram of a filter incorporating multiple SAW resonators.
Figure 3:
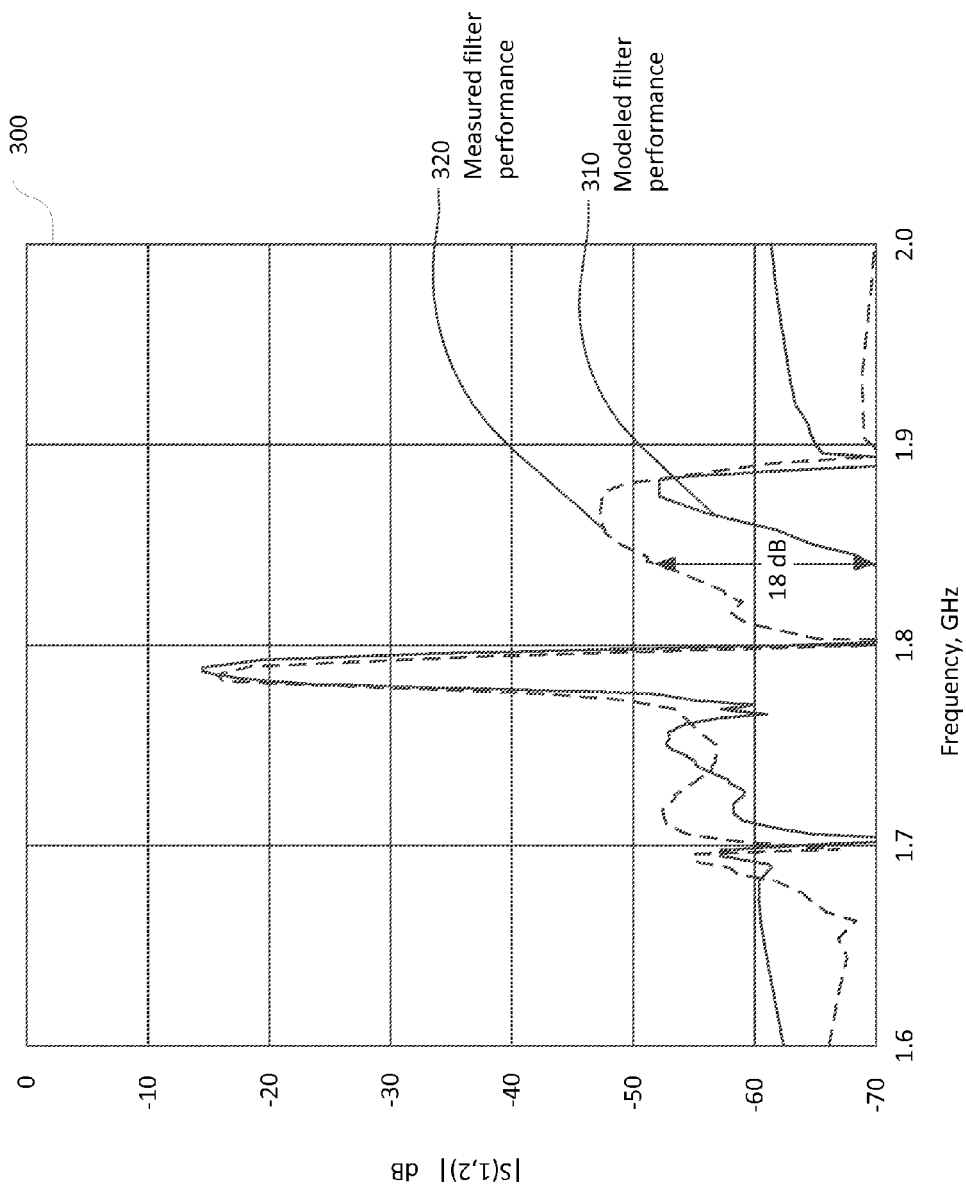
FIG. 3 is a graph comparing modeled and measured performance of a SAW band pass/band reject filter.
Figure 4:
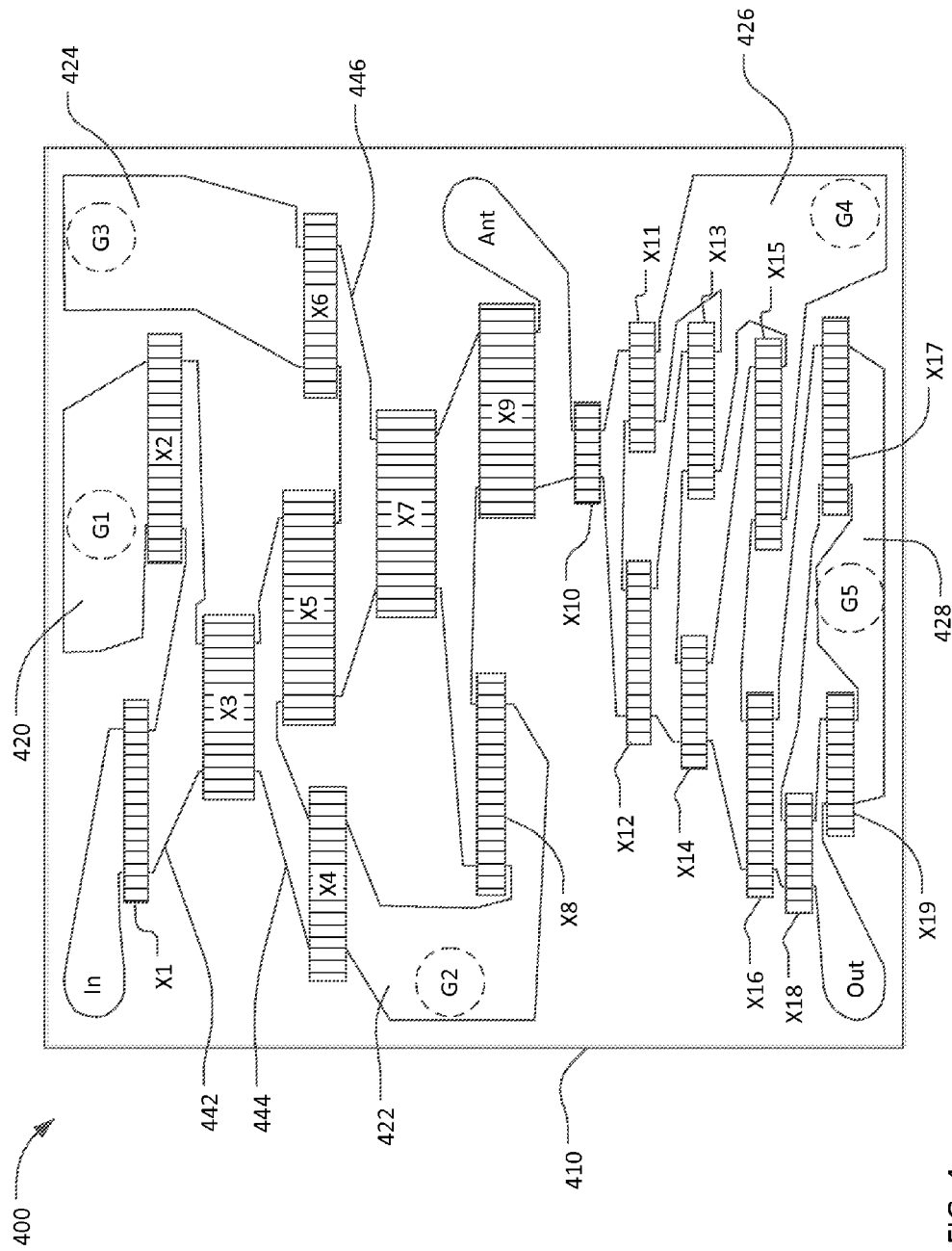
FIG. 4 is a schematic plan view of a SAW duplexer filter device.

FIG. 4 is greatly magnified schematic plan view of a duplexer 400 fabricated by depositing thin film conductors on a piezoelectric substrate 410. Each of the blocks labeled X1 through X19 represents a SAW resonator formed by interdigitated conductors too fine to show in the figure. As is known in the art, each SAW resonator X1-X19 may have a resonance at a first frequency and an anti-resonance at a second frequency. The frequencies of the resonance and anti-resonance of each SAW resonator X1-X19 are determined primarily by the pitch and orientation of the interdigitated conductors and the choice of substrate material and its orientation.

The nineteen SAW resonators X1-X19 are interconnected by thin film conductors to form the duplexer circuit. The duplexer 400 includes an input pad, an antenna pad, and an output pad (labeled "in", "ant", and "out", respectively) to couple RF signals to/from the duplexer. When the duplexer is incorporated into a device such as a cellular telephone, a transmitter may be connected to the input pad, an antenna may be connected to the antenna pad, and a receiver may be connected to the output pad. The duplexer 400 also includes five ground pads (labeled "G1" through "G5") to connect the duplexer to an external ground plane. The five ground pads G1 to G5 are not formed separately, but are predetermined regions of ground conductors 420, 422, 424, 426, and 428.

Figure 5:
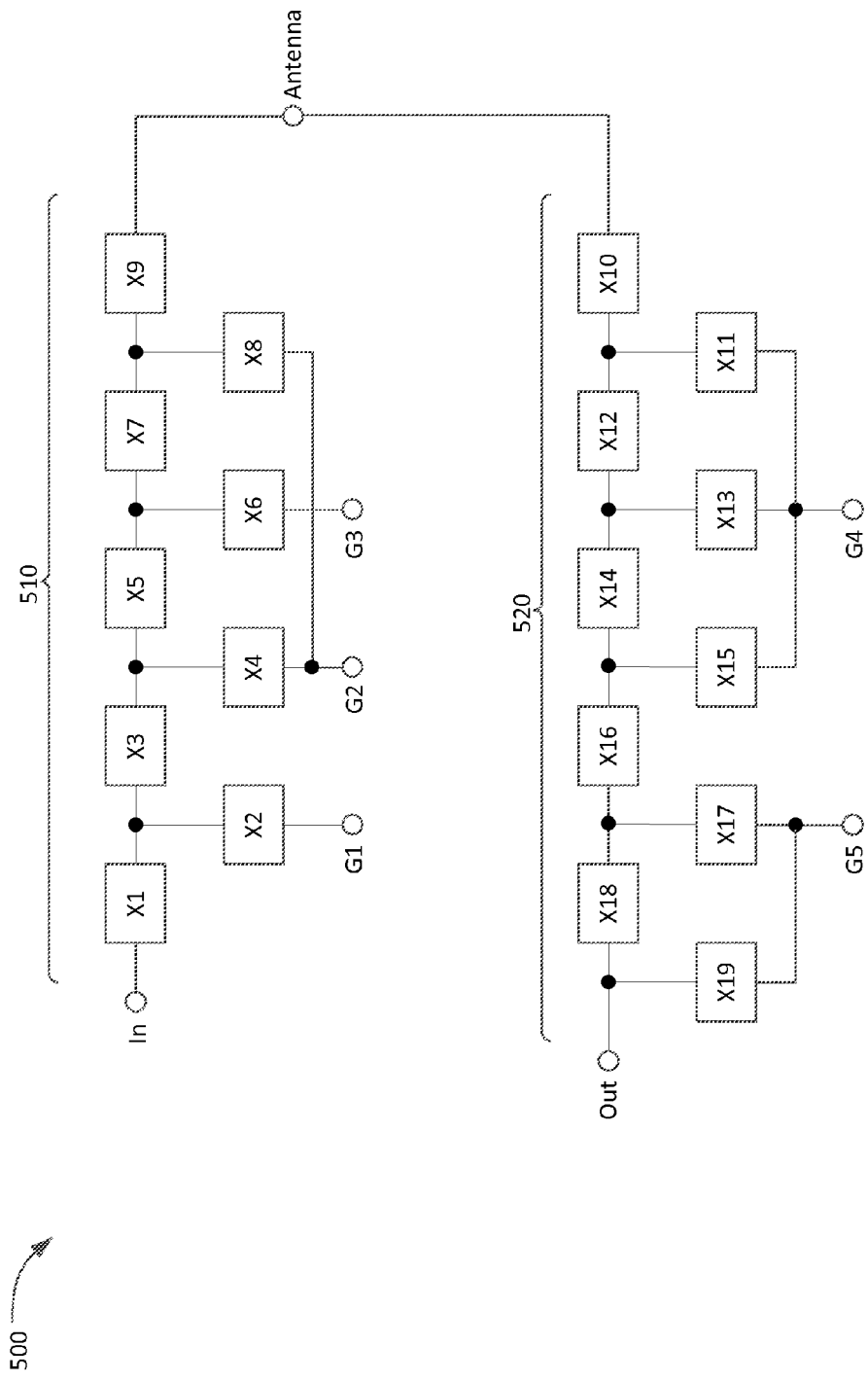
FIG. 5 is a schematic circuit diagram of a duplexer filter device.

FIG. 5 is a schematic circuit diagram of a duplexer 500 which may be the duplexer 400 shown in FIG. 4. The duplexer 500 includes a transmit filter 510 connected between an input pad ("In") and an antenna pad ("Antenna") and a receive filter 520 connected between the antenna pad and an output pad ("Out"). The transmit filter 510 includes SAW resonators X1-X9. SAW resonators X1, X3, X5, X7, and X9 are series resonators and SAW resonators X2, X4, X6, and X8 are shunt resonators. The receive filter 520 includes SAW resonators X10-X19. SAW resonators X10, X12, X14, X16, and X18 are series resonators and SAW resonators X11, X13, X15, X17, and X19 are shunt resonators. The input pad, the antenna pad, the output pad, the series resonators, and a first end of each of the shunt resonators are interconnected by signal conductors (such as signal conductors 442, 444, and 446 in FIG. 4). A second end of each of the shunt resonators is connected to one of the ground pads G1 to G5 by respective ground conductors (420, 422, 424, 426, 428 in FIG. 4). Note that ground pads G1, G2, and G3 are associated with the transmit filter and ground pads G4 and G5 are associated with the receive filter. On the substrate 410 of the duplexer 400, the ground pads and ground conductors associated with the transmit filter may be electrically isolated from the ground pads and ground conductors associated with the receive filter.

The transmit filter 510 may be designed to convey RF signals within a transmit frequency band from the transmitter connected to the input pad of the duplexer to the antenna connected to antenna pad, while blocking RF signals in other frequency bands. The receive filter 520 may be designed to convey RF signals within a receive frequency band from the antenna connected to the antenna pad to a receiver connected to the output pad, while blocking RF signals in other frequency bands.

The RF signal from the transmitter introduced at the input pad may be substantially higher power than the receive signals from the antenna introduced at antenna pad. To prevent leakage of the transmit signal into the input of the receiver connected to output pad, the duplexer 400/500 may be designed to provide very high isolation between the input pad and the output pad, particular for the receive frequency band, but also for the transmit frequency band.

Figure 6:
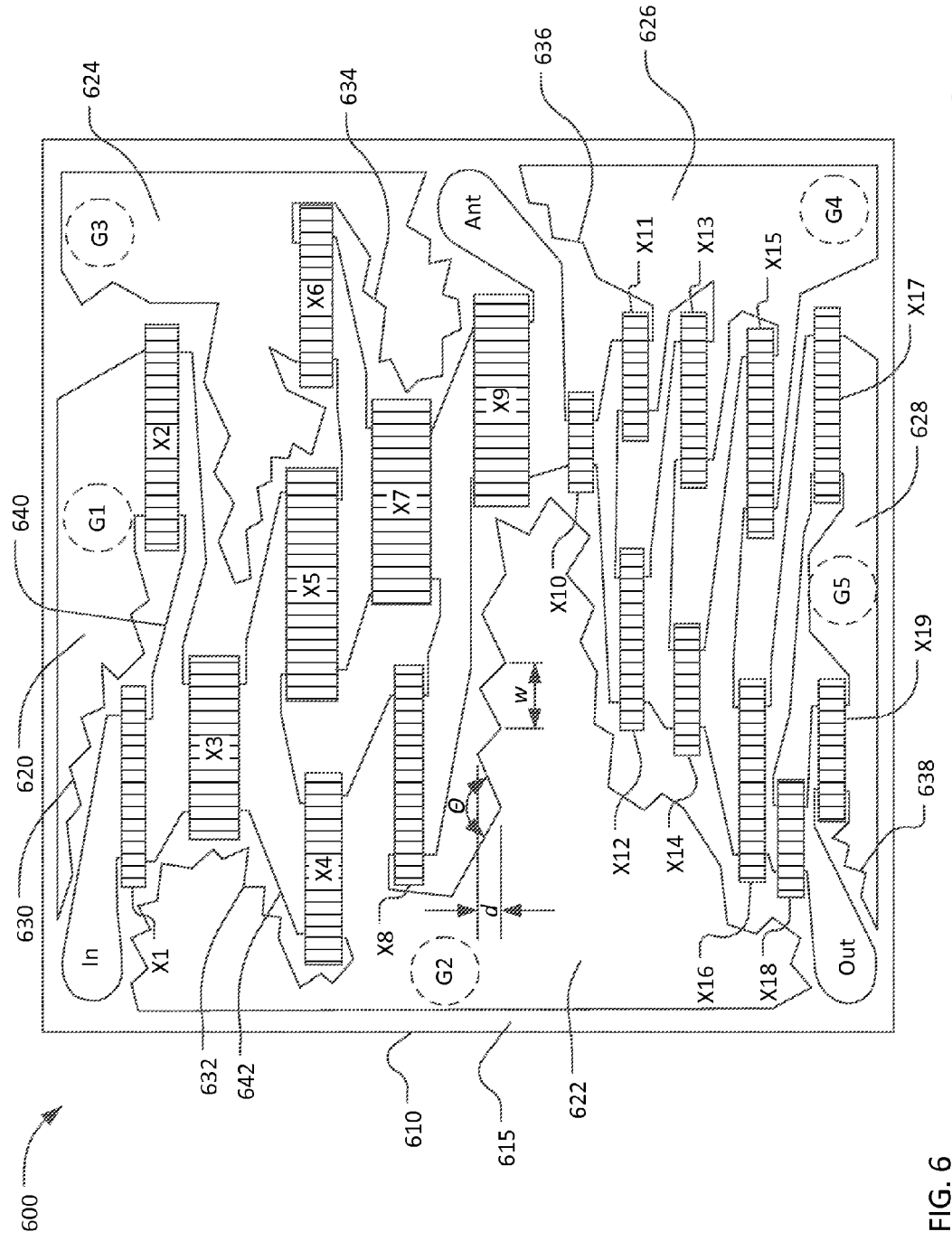
FIG. 6 is a schematic plan view of a SAW duplexer filter device incorporating serrated ground electrodes.
Figure 7:
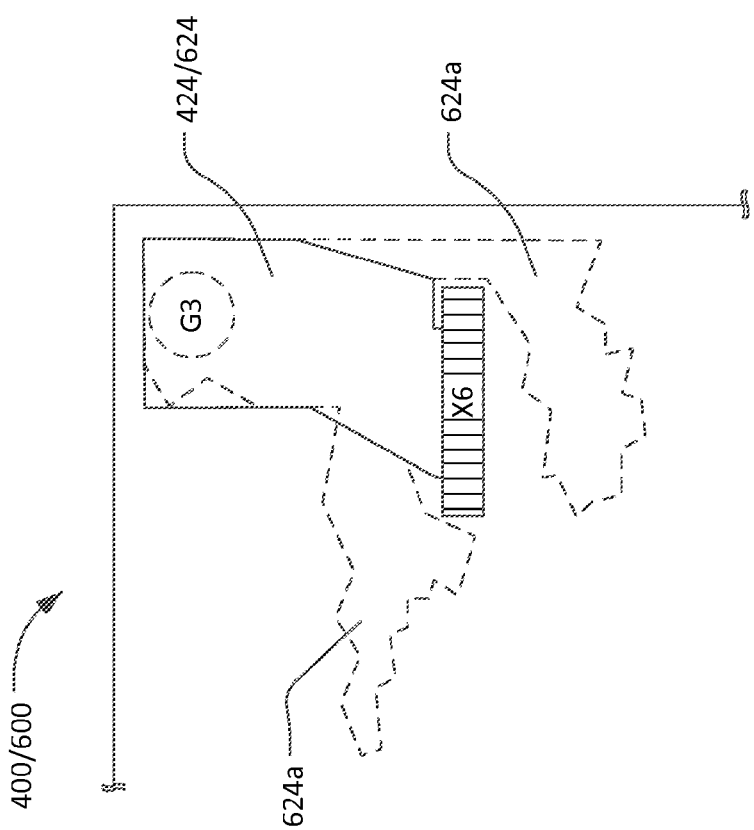
FIG. 7 is a detail view comparing portions of the SAW duplexer filter devices of FIG. 4 and FIG. 6.

FIG. 6 is greatly magnified schematic plan view of an improved duplexer 600. The improved duplexer has 19 SAW resonators arranged similarly to those of the duplexer 400 of FIG. 4. The electrical schematic diagram of the duplexer 600 is essentially the same as shown in FIG. 5. Resonators X1-X9 form a transmit filter and resonators X10-X19 form a receive filter. Resonators X1, X3, X5, X7, X9, X10, X12, X13, X4, X16, and X18 are series resonators. Resonators X2, X4, X6, X8, X11, X13, X15, X17, and X19 are shunt resonators. One end of each shunt resonators is connected to one of five grounds pads G1-G5 by respective ground conductors 620, 622, 624, 626, 628.

At least some edges of the ground conductors 620, 622, 624, 626, 628 are serrated, which is to say at least some edges of the ground conductors are formed into plural teeth or serrations, such as serrations 630, 632, 634, 636, 638. The serrated edges of the ground conductors may face one or more of the SAW resonators. All or portions of the serrated edges of the ground conductors may face signal conductors interconnecting the SAW resonators. For example, some of the serrations on ground conductor 620 face signal conductor 640, and some of the serrations on ground conductor 622 face signal conductor 642. Although not present in this example, serrated edges of the ground conductors may face other ground conductors.

The serrations along the edges of the ground conductors may be triangular, as shown in FIG. 6. Some or all of the serrations may be or include convex curved portions, concave curved portions, or combinations of straight, convex, and/or concave portions. Curved portions may be circular, parabolic, sinusoidal, or some other shape.

The multiple serrations along at least some edges of the ground conductors are not necessarily uniform in size or shape. In the case of triangular serrations, the width w, depth d, and internal angle Θ of the serrations may vary. The width w and depth d of the serrations may be large compared to the wavelength of the acoustic waves propagating on the surface of the substrate. For example, the width w and depth d of each serration may be between 10 microns and 100 microns. The internal angle Θ of each serration may be from 45 degrees to 135 degrees. Serrations such as serrations 630, 632, 634, 636, 638 may scatter acoustic waves to reduce undesired acoustic coupling between SAW resonators. Triangular serrations having an internal angle Θ near 90 degrees may function to retro-reflect at least a portion of incident acoustic waves.

Ground conductors 620, 622, 624, 626, 628 extend over much of the usable surface area of the piezoelectric substrate not occupied by SAW resonators and signal conductors. A gutter 615 around the perimeter of the piezoelectric substrate 610 may be required to facilitate excising the duplexer 600 from a larger wafer. The gutter 615 is not considered usable surface area. The ground conductors 620, 622, 624, 626, 628, in aggregate, may cover at least 50% of the usable surface area of the piezoelectric substrate 610 not occupied by SAW resonators, and signal conductors.

Figure 8:
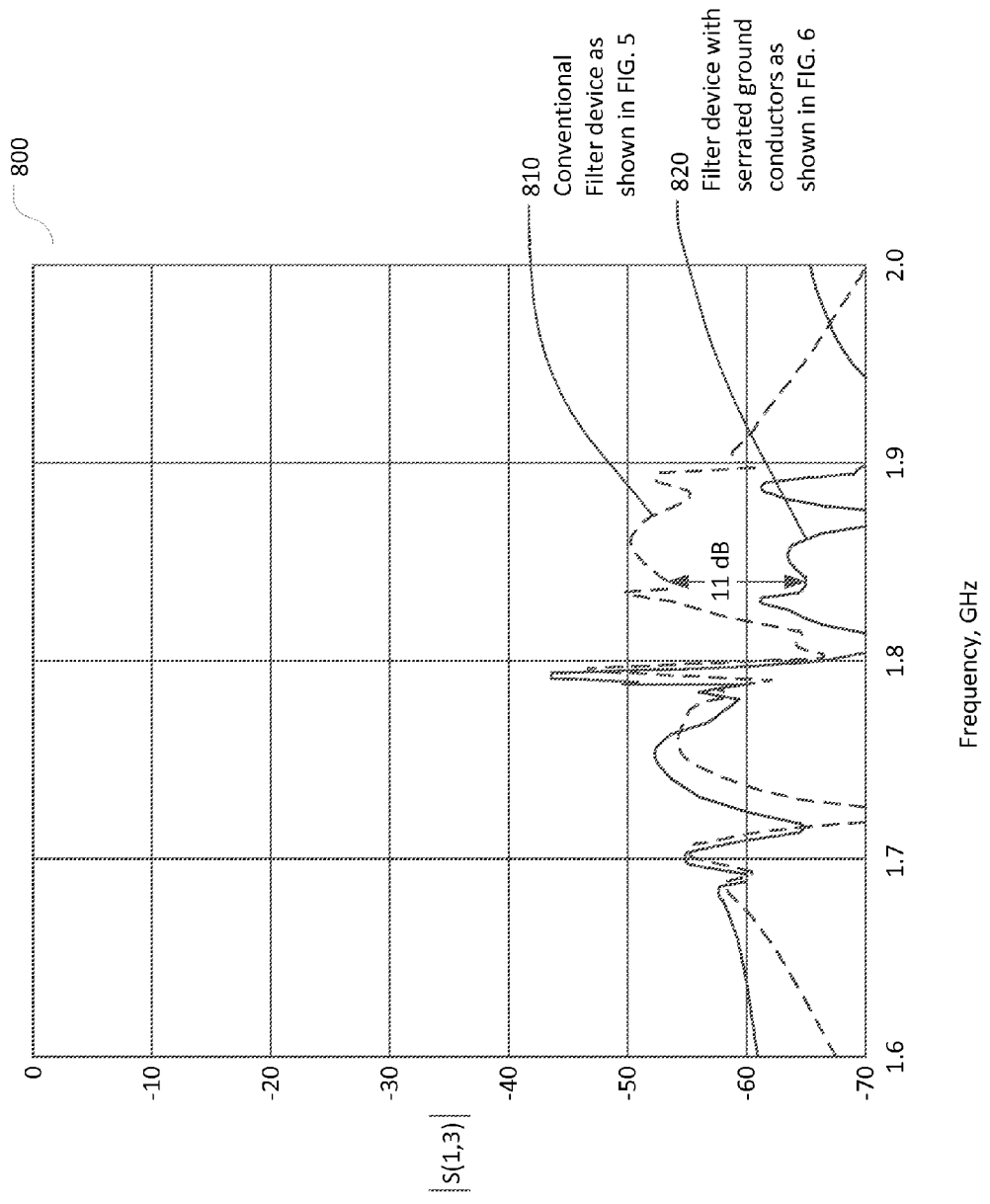
FIG. 8 is a graph comparing measured performance of the SAW duplexer filter devices of FIG. 4 and FIG. 6.

FIG. 8 shows a graph 800 comparing the |S(1,3)| parameter for the conventional duplexer of FIG. 4 (dashed curve 810) and the improved duplexer of FIG. 6 (solid curve 820). The |S(1,3)| parameter is the magnitude of the coupling between the input pad and the output pad of the duplexer. The improved duplexer of FIG. 6 provides about 10 dB to 15 dB lower coupling (i.e. 10 dB to 15 dB greater isolation) between port 1 and port 3 over the frequency range from 1.805 to 1.88 GHz.

Figure 9:
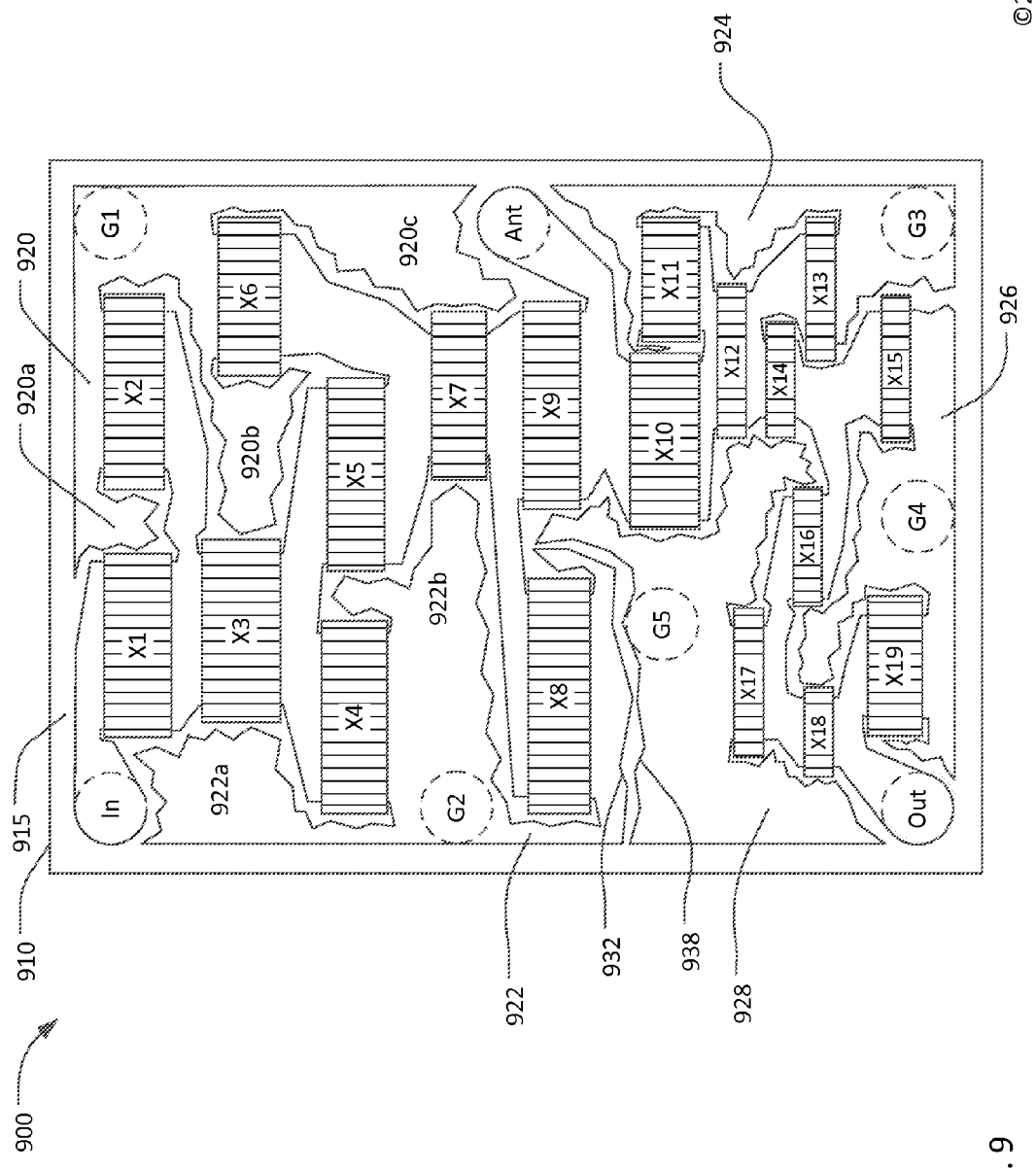
FIG. 9 is a schematic plan view of another SAW duplexer filter device incorporating serrated ground electrodes.

FIG. 9 is greatly magnified schematic plan view of another duplexer 900. The electrical schematic diagram of the duplexer 900 is similar to that shown in FIG. 5 except for the arrangement of ground pads and ground conductors. Resonators X1-X9 form a transmit filter connected between an input pad ("In") and an antenna pad ("Antenna"). Resonators X10-X19 form a receive filter connected from the antenna pad to an output pad ("Out"). Resonators X1, X3, X5, X7, X9, X10, X12, X13, X4, X16, and X18 are series resonators. Resonators X2, X4, X6, X8, X11, X13, X15, X17, and X19 are shunt resonators.

Ground conductor 920 connects ground pad G1 to shunt resonators X2 and X6. Ground conductor 920 includes extended portions 920a, 920b, and 920c that fill areas of the piezoelectric substrate 910 not occupied by resonators or signal conductors. Extended portions 920a, 920b, and 920c are not required to connect ground pad G1 to resonators X2 and X6, but are specifically intended to reduce undesired coupling between resonators in the duplexer 900. Ground conductor 922 connects ground pad G2 to shunt resonators X4 and X8. Ground conductor 922 includes extended portions 922a and 922b that fill areas of the piezoelectric substrate 910 not occupied by resonators or signal conductors. Extended portions 922a and 922b are not required to connect ground pad G2 to resonators X4 and X8.

Ground conductor 924 connects ground pad G3 to shunt resonators X11 and X13. Ground conductor 926 connects ground pad G4 to shunt resonators X15 and X19. Ground conductor 928 connects ground pad G5 to shunt resonator X17. Each of ground conductors 924, 926, and 928 includes one or more extended portions (shown but not identified) that fill areas of the piezoelectric substrate 910 not occupied by resonators or signal conductors. Note that an edge 932 of ground conductor 922 faces an edge 938 of ground conductor 928. Both edges 932 and 938 may be serrated as shown. Each of the ground pads G1-G5 is electrically isolated from the other ground pads on the piezoelectric substrate 610. The ground conductors 920, 922, 924, 926, 928, in aggregate, may cover at least 70% of the usable surface area (i.e. the surface area exclusive of the gutter 915) of the piezoelectric substrate 910 not occupied by SAW resonators, and signal conductors.

While the previously discussed examples demonstrate the effectiveness of serrated ground conductors to improve isolation in a duplexer, serrated ground conductors may also be employed to reduce undesired acoustic coupling between SAW resonators to increase rejection in band reject filters.

It is claimed:

1. A filter device formed on a surface of a substrate, comprising:
    a plurality of surface acoustic wave series resonators;
    a plurality of surface acoustic wave shunt resonators;
    an input pad, an output pad, and a plurality of ground pads;
    a plurality of signal conductors that interconnect the input pad, the output pad, the plurality of surface acoustic wave series resonators and a first end of each of plurality of surface acoustic wave shunt resonators; and
    a plurality of ground conductors, each of the plurality of ground conductors connecting a corresponding one of the plurality of ground pads with a second end of one or more of the plurality of surface acoustic wave shunt resonators, wherein
        at least a portion of an edge of at least one of the plurality of ground conductors is shaped as a plurality of serrations, and
        the plurality of ground conductors, in aggregate, cover more than 50% of a useable area of the substrate not occupied by the series resonators, the shunt resonators, and the signal conductors.

2. The filter device of claim 1, wherein at least a portion of respective edges of two or more of the plurality of ground conductors are shaped as a plurality of serrations.

3. The filter device of claim 1, wherein at least a portion of respective edges of every one of the plurality of ground conductors are shaped as a plurality of serrations.

4. The filter device of claim 1, wherein each of the plurality of ground pads is electrically isolated from all other ground pads from the plurality of ground pads.

5. The filter device of claim 1, wherein the plurality of ground conductors, in aggregate, cover at least 70% of the useable area of the substrate not occupied by the series resonators, the shunt resonators, and the signal conductors.

6. A duplexer device formed on a surface of a substrate, comprising:
    an input pad, an antenna pad, an output pad, and at least one ground pad;
    a transmit filter coupled between the input pad and the antenna pad, the transmit filter comprising:
        a plurality of transmit surface acoustic wave shunt resonators;
        one or more transmit ground pads; and
        one or more transmit ground conductors respectively connecting each of the transmit ground pads to one or more of the plurality of transmit surface acoustic wave shunt resonators, at least a portion of edges of the transmit ground conductors shaped as a plurality of serrations; and
    a receive filter coupled between the antenna pad and the output pad, the receive filter comprising:
        a plurality of receive surface acoustic wave shunt resonators;
        one or more receive ground pads; and
        one or more receive ground conductors respectively connecting each of the receive ground pads to one or more of the plurality of receive surface acoustic wave shunt resonators, at least a portion of edges of the receive ground conductors shaped as a plurality of serrations, wherein the one or more receive ground conductors and the one or more transmit ground conductors, in aggregate, cover more than 50% of a useable area of the substrate not occupied by the series resonators, the shunt resonators, and the signal conductors.

7. The duplexer device of claim 6, wherein one end of each of the plurality of transmit surface acoustic wave shunt resonators is connected to one of the one or more transmit ground pads, and one end of each of the plurality of receive surface acoustic wave shunt resonators is connected to one of the one or more receive ground pads.

8. The duplexer device of claim 6, wherein the receive ground pads and receive ground conductor are electrically isolated from the transmit ground pads and the transmit ground conductors.

9. The filter device of claim 6, wherein the one or more receive ground conductors and the one or more transmit ground conductors, in aggregate, cover at least 70% of the useable area of the substrate not occupied by the series resonators, the shunt resonators, and the signal conductors.

\* \* \* \* \*